US011574804B2

(12) United States Patent
Watanabe et al.

(10) Patent No.: US 11,574,804 B2
(45) Date of Patent: *Feb. 7, 2023

(54) WORKPIECE PROCESSING AND RESIN GRINDING APPARATUS

(71) Applicant: DISCO CORPORATION, Tokyo (JP)

(72) Inventors: Shinya Watanabe, Tokyo (JP); Ichiro Yamahata, Tokyo (JP); Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 244 days.

This patent is subject to a terminal disclaimer.

(21) Appl. No.: 16/216,394

(22) Filed: Dec. 11, 2018

(65) Prior Publication Data

US 2019/0206673 A1 Jul. 4, 2019

(30) Foreign Application Priority Data

Dec. 28, 2017 (JP) .............................. JP2017-253566

(51) Int. Cl.
*H01L 21/02* (2006.01)
*H01L 21/67* (2006.01)
(Continued)

(52) U.S. Cl.
CPC .......... *H01L 21/02013* (2013.01); *B05B 3/00* (2013.01); *B24B 7/10* (2013.01); *B24B 7/228* (2013.01); *B24B 37/00* (2013.01); *B24B 37/08* (2013.01); *B24B 37/34* (2013.01); *B24B 37/345* (2013.01); *B24B 41/005* (2013.01); *B24B 49/02* (2013.01); *B24B 49/03* (2013.01);
(Continued)

(58) Field of Classification Search
CPC ... B05C 11/1005; B24B 37/00; B24B 37/013; B24B 7/228; B24B 49/03; H01L 21/6773; H01L 21/78; H01L 21/02013; H01L 21/30625; H01L 21/3212; H01L 22/12
See application file for complete search history.

(56) References Cited

U.S. PATENT DOCUMENTS 5,632,667 A * 5/1997 Earl ........................ B24B 7/228
257/E21.237
6,193,586 B1 * 2/2001 Park ...................... B24B 41/061
451/41

(Continued)

FOREIGN PATENT DOCUMENTS

JP 2009043931 A 2/2009
JP 2018186217 A * 11/2018 ....... H01L 21/67092

*Primary Examiner* — Karl Kurple
(74) *Attorney, Agent, or Firm* — Greer Burns & Crain, Ltd.

(57) ABSTRACT

A processing apparatus used in processing a workpiece having a device in each of a plurality of regions that includes a chuck table holding the workpiece, positioning means positioning the workpiece before grinding, resin coating means including a rotatable spinner table for coating the workpiece with a resin, cleaning means, a grinding unit, and a transfer unit. The transfer unit includes a first transfer unit transferring the workpiece from the positioning means to the spinner table and from the spinner table to the chuck table, a second transfer unit transferring the workpiece from the chuck table to the cleaning means, and a front/back surface inversion transfer unit taking over the workpiece from the cleaning means to the second transfer unit.

4 Claims, 4 Drawing Sheets

(51) Int. Cl.
*B24B 7/22* (2006.01)
*B05C 11/10* (2006.01)
*B24B 49/12* (2006.01)
*B24B 53/017* (2012.01)
*H01L 21/78* (2006.01)
*H01L 21/3105* (2006.01)
*H01L 21/304* (2006.01)
*B24B 41/00* (2006.01)
*B24B 37/00* (2012.01)
*B24B 49/04* (2006.01)
*B24B 37/34* (2012.01)
*B24B 49/02* (2006.01)
*B24B 7/10* (2006.01)
*B24B 37/08* (2012.01)
*B24B 53/007* (2006.01)
*B24B 49/03* (2006.01)
*B24B 55/02* (2006.01)
*B05B 3/00* (2006.01)
*B05C 9/12* (2006.01)

(52) U.S. Cl.
CPC .............. *B24B 49/04* (2013.01); *B24B 49/12* (2013.01); *B24B 53/007* (2013.01); *B24B 53/017* (2013.01); *B24B 55/02* (2013.01); *H01L 21/02065* (2013.01); *H01L 21/304* (2013.01); *H01L 21/31058* (2013.01); *H01L 21/67092* (2013.01); *H01L 21/67253* (2013.01); *H01L 21/78* (2013.01); *B05C 9/12* (2013.01); *B05C 11/1005* (2013.01)

(56) References Cited

U.S. PATENT DOCUMENTS

| | | | |
|---|---|---|---|
| 2002/0052169 A1* | 5/2002 | Vepa | H01L 21/67219 451/11 |
| 2002/0102920 A1* | 8/2002 | Vogtmann | B24B 7/228 451/41 |
| 2003/0186546 A1* | 10/2003 | Wollstein | B24B 49/03 438/689 |
| 2003/0207655 A1* | 11/2003 | Jackson | B24C 11/005 451/38 |
| 2003/0209310 A1* | 11/2003 | Fuentes, Jr. | B24B 37/042 156/154 |
| 2004/0157530 A1* | 8/2004 | Omata | B24B 19/12 451/5 |
| 2005/0054274 A1* | 3/2005 | Kajiyama | H01L 21/6715 451/41 |
| 2009/0042488 A1* | 2/2009 | Sekiya | B24B 7/228 451/41 |
| 2009/0203212 A1* | 8/2009 | Ichikawa | H01L 21/02008 257/E21.224 |
| 2010/0021688 A1* | 1/2010 | Kato | H01L 21/3221 428/141 |
| 2012/0080138 A1* | 4/2012 | Yew | B24B 37/042 156/153 |
| 2015/0357199 A1* | 12/2015 | Kramer | B24B 57/02 438/692 |
| 2018/0040469 A1* | 2/2018 | Seddon | H01L 21/78 |
| 2018/0099377 A1* | 4/2018 | Sekiya | H01L 21/67092 |
| 2018/0151343 A1* | 5/2018 | Takiguchi | B24B 37/042 |
| 2018/0290265 A1* | 10/2018 | Usami | B24D 7/066 |
| 2018/0315635 A1* | 11/2018 | Yamamoto | H01L 21/6835 |
| 2019/0198357 A1* | 6/2019 | Watanabe | H01L 22/12 |
| 2020/0262029 A1* | 8/2020 | Yoshii | H01L 21/67219 |
| 2021/0242010 A1* | 8/2021 | Tanoue | H01L 21/67259 |
| 2021/0327772 A1* | 10/2021 | Tanoue | H01L 21/67075 |
| 2022/0199407 A1* | 6/2022 | Fujimura | H01L 21/304 |

* cited by examiner

WORKPIECE PROCESSING AND RESIN GRINDING APPARATUS

BACKGROUND OF THE INVENTION

Field of the Invention

The present invention relates to a workpiece processing method and a processing apparatus.

Description of the Related Art

In a semiconductor device manufacturing process, streets (dividing lines) are formed in a grid pattern on a front surface of a workpiece, and a device such as an integrated circuit (IC), a large-scale integration circuit (LSI), or the like is formed in each of regions demarcated by the streets. The workpiece is thinned to a predetermined thickness by grinding a back surface of the workpiece. The workpiece is thereafter divided along the streets by a cutting apparatus or the like to manufacture individual semiconductor device chips. When the workpiece is ground to be thinned, the workpiece has the front surface coated with a resin in order to protect the devices. In order to enhance thickness precision of the coated resin, a step of flattening by grinding the coated resin on the front surface of the workpiece is performed (see Japanese Patent Laid-Open No. 2009-43931, for example).

SUMMARY OF THE INVENTION

However, after the above step is performed to grind the coated resin on the front surface of the workpiece, a step is performed in which the back surface of the workpiece is ground by another grinding apparatus, thereby causing disadvantage of increasing the number of steps of grinding.

It is therefore an object of the present invention to provide a workpiece processing method and a processing apparatus capable of efficiently processing the workpiece without increasing the number of steps of grinding.

In accordance with an aspect of the present invention, there is provided a workpiece processing method of grinding a resin coated on a front surface of a workpiece having a device in each of a plurality of regions demarcated by a plurality of dividing lines formed on the front surface of the workpiece in a grid pattern and of grinding a back surface of the workpiece. The workpiece processing method includes a resin coating step of coating the resin on the front surface of the workpiece, a resin curing step of applying an ultraviolet ray to the coated resin to be cured, a resin grinding step of grinding the cured resin with grinding stones to be flattened, and a workpiece grinding step of holding the flattened resin side of the workpiece on a chuck table and grinding the back surface of the workpiece with grinding stones. In the resin grinding step, grinding is performed while cleaning the resin stuck to the grinding stones.

Preferably, in the resin grinding step, cleaning water is jetted from a cleaning nozzle to the grinding stones, and the resin is ground with the grinding stones while cleaning the resin stuck to the grinding stones.

Preferably, after the resin grinding step is performed, a transfer unit which loads/unloads the workpiece to/from the chuck table and causes the front surface and the back surface of the workpiece unloaded from the chuck table to be inverted is used to invert the front surface and the back surface of the workpiece, and the same grinding stones are used in the resin grinding step and the workpiece grinding step.

In accordance with another aspect of the present invention, there is provided a processing apparatus used in processing of a workpiece having a device in each of a plurality of regions demarcated by a plurality of dividing lines formed on a front surface of the workpiece in a grid pattern. The processing apparatus includes a chuck table holding the workpiece, a grinding unit including grinding stones which grind a back surface of the workpiece having the front surface coated with a resin, and the resin coated on the front surface, and a transfer unit loading/unloading the workpiece to/from the chuck table and causing the front surface and the back surface of the workpiece unloaded from the chuck table to be inverted.

Preferably, a resin thickness of the resin after grinding with the grinding stones is measured, and the back surface of the workpiece is thinned to a predetermined thickness.

Preferably, the processing apparatus further includes a cleaning nozzle which jets cleaning water to the grinding stones, and the resin is ground with the grinding stones while the resin stuck to the grinding stones is cleaned.

Preferably, the front surface and the back surface of the workpiece are inverted by the transfer unit, and grinding of the resin and grinding of the back surface of the workpiece are performed by use of the same grinding stones.

According to the present invention, it is possible to grind the resin coated on the front surface of the workpiece and the back surface of the workpiece in the same apparatus. Thus, according to the present invention, the number of steps of grinding is not increased, and therefore, processing of the workpiece can be efficiently performed.

In the resin grinding step, the cleaning water is jetted from the cleaning nozzle to the grinding stones, and the resin is ground while the resin stuck to the grinding stones is cleaned, no resin remains on the grinding stones after the resin grinding step is ended. Accordingly, even if the workpiece grinding step is performed by use of the same grinding stones, it is possible to favorably thin the workpiece.

After the resin grinding step is performed, it is possible to invert the front surface and the back surface of the workpiece by the transfer unit which loads/unloads the workpiece to/from the chuck table and causes the front surface and the back surface of the workpiece unloaded from the chuck table to be inverted. Accordingly, it is possible to use the same grinding stones in the resin grinding step and the workpiece grinding step, thereby enhancing processing efficiency.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1. Processing Apparatus

Figure 1:
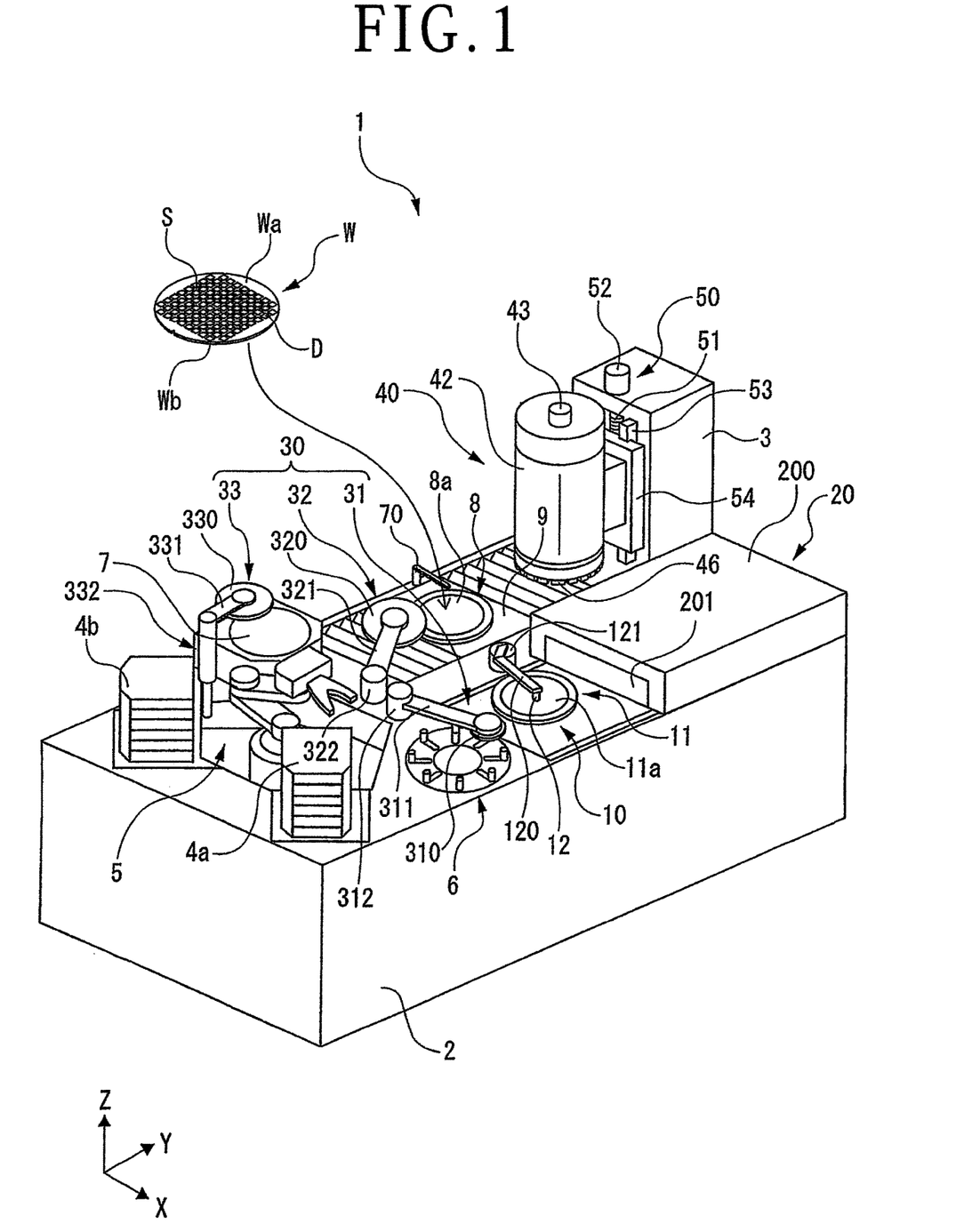
FIG. 1 is a perspective view illustrating a configuration of a processing apparatus.

A processing apparatus 1 illustrated in FIG. 1 is an example of a grinding apparatus used for grinding processing of a workpiece W. The workpiece W is an example of a workpiece in a circular disc shape, and formed is a device D formed in each of a plurality of regions demarcated by a plurality of dividing lines S formed on a front surface Wa of the workpiece W in a grid pattern. A back surface Wb opposite the front surface Wa of the workpiece W is used for a surface to be processed on which grinding processing is performed. The workpiece W illustrated in the present embodiment includes a silicon wafer, for example.

The processing apparatus 1 has an apparatus base 2 extending a Y-axis direction, and on a front side of the Y-axis direction of the apparatus base 2, a cassette 4a and a cassette 4b are disposed. The cassette 4a houses the workpiece W before grinding, and the cassette 4b houses the workpiece W after grinding. In the vicinity of the cassettes 4a and 4b, disposed is loading/unloading means 5 unloading the workpiece W before grinding from the cassette 4a and loading the workpiece W after grinding into the cassette 4b. In a movable range of the loading/unloading means 5, positioning means 6 and cleaning means 7 are disposed. The positioning means 6 positions the workpiece W before grinding to a predetermined position, and the cleaning means 7 cleans the workpiece W after processing.

The processing apparatus 1 includes a chuck table 8, resin coating means 10, resin curing means 20, a transfer unit 30, a grinding unit 40, and lifting means 50. The chuck table 8 holds the workpiece W. The resin coating means 10 coats the front surface Wa of the workpiece W with a resin. The resin curing means 20 cures the coated resin on the front surface Wa of the workpiece W. The transfer unit 30 loads/unloads the workpiece W to/from the chuck table 8 and inverts the front surface and the back surface of the workpiece W which is unloaded from the chuck table 8. The grinding unit 40 includes grinding stones 46 grinding the back surface Wb of the workpiece W having the front surface Wa coated with a resin, and the resin coated on the front surface Wa. The lifting means 50 lifts the grinding unit 40 up and down in a vertical direction (Z-axis direction).

An upper surface of the chuck table 8 serves as a holding surface 8a sucking and holding the workpiece W, and the holding surface 8a is connected to a suction source. The periphery of the chuck table 8 is covered with a cover 9. Moving means causing the chuck table 8 to move in the Y-axis direction is connected below the chuck table 8. Note that, although not illustrated, in practical use, the holding surface 8a of the chuck table 8 is an inclined surface which is inclined downward toward an outer peripheral direction of the holding surface 8a with its central portion serving as a top.

The resin coating means 10 includes a spinner table 11 holding the workpiece W in a rotatable manner, and a resin nozzle 12 dropping a resin onto the workpiece W held on the spinner table 11. An upper surface of the spinner table 11 serves as a holding surface 11a sucking and holding the workpiece W, and the holding surface 11a is connected to a suction source. Rotating means (rotating means 13 illustrated in FIG. 3) rotating the spinner table 11 and moving means causing the spinner table 11 to move in the Y-axis direction are connected below the spinner table 11. The resin nozzle 12 is disposed at one end of an arm 120. At the other end of the arm 120, a turning axis 121 is connected, so that the arm 120 can turn horizontally about the turning axis 121. Turning of the arm 120 enables the resin nozzle 12 to move in a radial direction above the spinner table 11.

The resin curing means 20 includes a process chamber 200 which is disposed at a position adjacent to the resin coating means 10 and has an inner space for subjecting the resin coated on the front surface Wa of the workpiece W to an ultraviolet ray irradiation. The process chamber 200 has, for example, a plurality of ultraviolet lamps therein. An opening 201 which allows the spinner table 11 to pass through is formed in front of (on a front side in the Y-axis direction) the process chamber 200.

The transfer unit 30 illustrated in the present embodiment includes a first transfer unit 31, a second transfer unit 32, and a front/back surface inversion transfer unit 33. The first transfer unit 31 loads the workpiece W which is positioned at a predetermined position by the positioning means 6 to the chuck table 8 and the spinner table 11. The second transfer unit 32 unloads the workpiece W after grinding has been performed from the chuck table 8. The front/back surface inversion transfer unit 33 causes the front surface and the back surface of the workpiece W to be inverted.

The first transfer unit 31 includes a transfer pad 310 disposed in the vicinity of the positioning means 6 and holding the workpiece W, an arm 311 supporting the transfer pad 310, a moving mechanism having a shaft portion 312 moving the arm 311 up and down while turning the arm 311 in a horizontal direction, and a motor connected to one end of the shaft portion 312. When the shaft portion 312 moves up and down in the Z-axis direction, it is possible to move the transfer pad 310 together with the arm 311 up and down in the Z-axis direction. In addition, when the shaft portion 312 rotates, the arm 311 turns in the horizontal direction, so that the transfer pad 310 can turn in the horizontal direction.

The second transfer unit 32 includes a transfer pad 320 disposed adjacent to the first transfer unit 31 and holding the workpiece W, an arm 321 supporting the transfer pad 320, and a moving mechanism having a shaft portion 322 moving the arm 321 up and down while turning the arm 321 in the horizontal direction, and a motor connected to one end of the shaft portion 322. When the shaft portion 322 moves up and down in the Z-axis direction, it is possible to move the transfer pad 320 together with the arm 321 up and down in the Z-axis direction. In addition, when the shaft portion 322 rotates, the arm 321 turns in the horizontal direction, so that the transfer pad 320 can turn in the horizontal direction.

The front/back surface inversion transfer unit 33 includes at least a transfer pad 330 disposed in the vicinity of the cleaning means 7 and holding the workpiece W, a horizontal support portion 331 horizontally supporting the transfer pad 330, and an inverting mechanism 332 inverting a front surface and a back surface of the transfer pad 330 in the horizontal support portion 331. Although not illustrated, the inverting mechanism 332 includes a rotary shaft having a shaft center in parallel to the horizontal support portion 331 in the horizontal direction. In the front/back surface inversion transfer unit 33, the transfer pad 330 is rotated in the horizontal support portion 331 with the transfer pad 330 holding the workpiece W, and thus, it is possible to invert the front surface and the back surface of the workpiece W. Also in the front/back surface inversion transfer unit 33, similarly to the first transfer unit 31 and the second transfer unit 32, it is possible to move the horizontal support portion 331 up and down while turning the horizontal support portion 331 in the horizontal direction. Note that a configuration and an arrangement position of the front/back surface inversion transfer unit 33 illustrated in the present embodiment are merely one mode and can be changed appropriately.

A column 3 is erected at a rear portion of the apparatus base 2 in the Y-axis direction. The grinding unit 40 is supported in front of the column 3 in a lifting manner by the lifting means 50. The lifting means 50 includes a ball screw 51 which extends in the Z-axis direction, a motor 52 which is connected to one end of the ball screw 51, a pair of guide rails 53 which extends in parallel to the ball screw 51, and a lifting portion 54 which has a nut therein screwed into the ball screw 51 and has a side portion in sliding contact with the guide rails 53. Then, the motor 52 pivotally moves the ball screw 51, allowing the grinding unit 40 to lift up and down in the Z-axis direction with the lifting portion 54 along the pair of guide rails 53.

Figure 2:
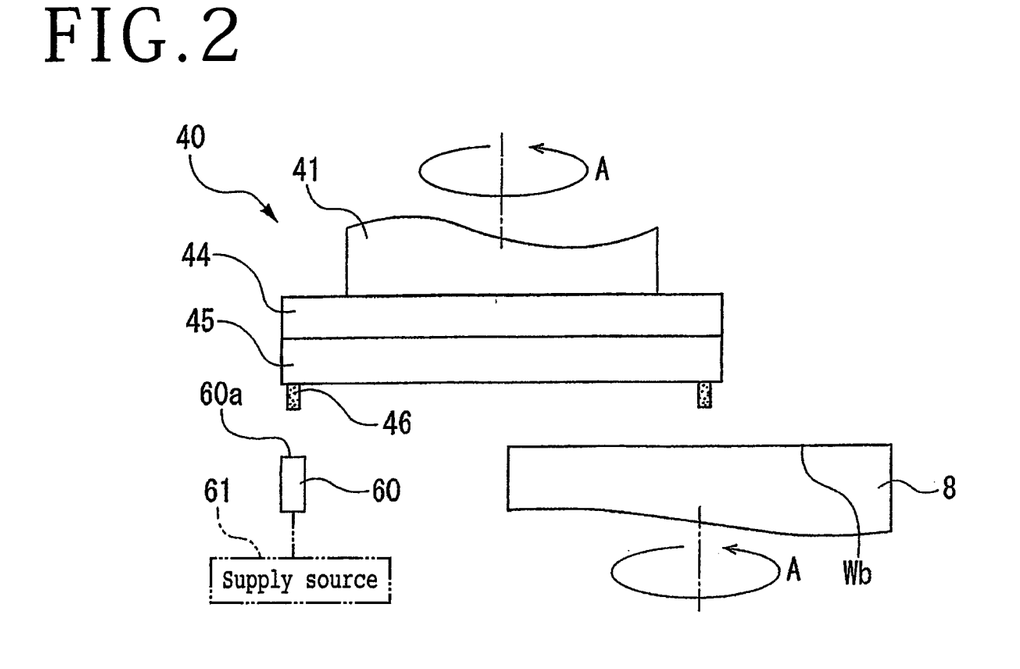
FIG. 2 is a partial cross-sectional side view illustrating each configuration of grinding means and a cleaning nozzle.

The grinding unit 40 includes a spindle 41 having a shaft center in the Z-axis direction, which is illustrated in FIG. 2, a spindle housing 42 surrounding an outer periphery of the spindle 41, a motor 43 attached to one end of the spindle 41, a grinding wheel 45 mounted to a lower end of the spindle 41 through a mount 44, and a plurality of grinding stones 46 fixedly attached to a lower portion of the grinding wheel 45 in an annular shape. The motor 43 rotates the spindle 41, and accordingly, it is possible to rotate the grinding wheel 45 at a predetermined rotational speed.

On a lower side of the grinding unit 40, provided is a cleaning nozzle 60 which jets cleaning water toward the grinding stones 46. A jetting port 60a is formed at an upper end of the cleaning nozzle 60, facing a lower surface side of the grinding stones 46. The cleaning nozzle 60 has a supply source 61 for supplying the cleaning water connected thereto. The cleaning nozzle 60 thus configured is used to wash a resin stuck to the grinding stones 46 with water when the resin coated on the front surface Wa of the workpiece W illustrated in FIG. 1 is ground with the grinding stones 46. An arrangement position of the cleaning nozzle 60 is, although not particularly limited, preferably directly below the grinding stones 46 and positions other than processing points (portions where the grinding stones 46 actually come in contact with the resin and the workpiece W) of the grinding stones 46.

The processing apparatus 1 includes measuring means 70 measuring a resin thickness of the resin after grinding with the grinding stones 46, and control means controlling the grinding unit 40 and the lifting means 50 on the basis of data on the resin thickness of the resin measured by the measuring means 70. The measuring means 70 illustrated in the figure includes, for example, a non-contact type optical measuring device, but this is not limitative. Alternatively, the measuring means 70 may include contact type measuring gauge. Thus, according to the processing apparatus 1 of the present invention, it is possible to measure the resin thickness of the resin after grinding with the grinding stones 46 and then make the back surface of the workpiece W thin to a predetermined thickness, and accordingly, the workpiece can be processed with higher precision.

Thus, since the processing apparatus 1 of the present invention includes the chuck table 8 holding the workpiece W, the grinding unit 40 including the grinding stones 46 grinding the back surface Wb of the workpiece W having the front surface Wa coated with a resin and the coated resin on the front surface Wa, and the transfer unit 30 loading/unloading the workpiece W to/from the chuck table 8 and causing the front surface and the back surface of the workpiece W unloaded from the chuck table 8 to be inverted, it is possible to perform grinding of the resin coated on the front surface Wa of the workpiece W and grinding of the back surface Wb of the workpiece W in the same apparatus. Accordingly, according to the present invention, it is possible to efficiently process the workpiece W without increasing the number of steps of grinding.

Also, when the resin coated on the front surface Wa of the workpiece W is ground with the grinding stones 46, cleaning water is jetted to the grinding stones 46 from the cleaning nozzle 60, and grinding is performed while cleaning the resin stuck to the grinding stones 46. Accordingly, even when the resin coated on the front surface Wa of the workpiece W is ground to be flattened, no resin remains on the grinding stones 46. Thus, it is possible to grind the back surface Wb of the workpiece W by use of the same grinding stones 46.

2. Workpiece Processing Method

A description will be next given regarding a workpiece processing method of performing grinding the resin coated on the front surface Wa of the workpiece W and grinding of the back surface Wb of the workpiece W. In the present embodiment, it is assumed to perform the workpiece processing method using the above processing apparatus 1. The cassette 4a of the processing apparatus 1 houses a plurality of the workpieces W before processing. The loading/unloading means 5 takes out the workpiece W before processing from the cassette 4a and transfers the workpiece W to the positioning means 6 to position the workpiece W at a predetermined position.

(1) Resin Coating Step

Figure 3:
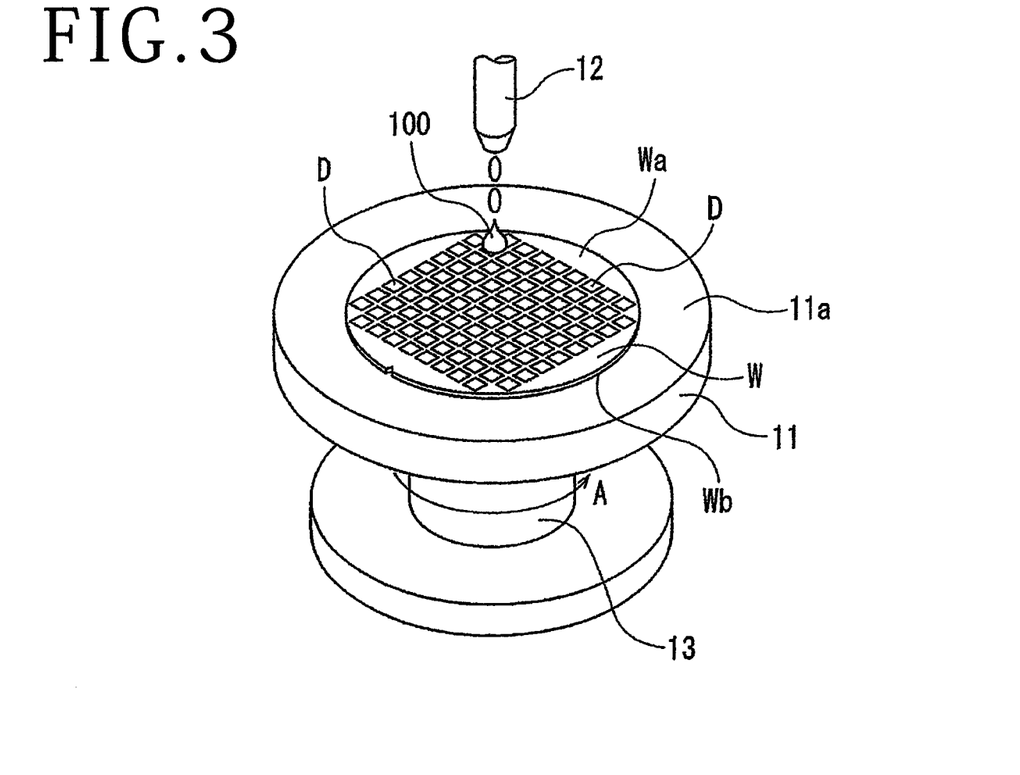
FIG. 3 is a perspective view illustrating a resin coating step.

The first transfer unit 31 unloads the workpiece W which has been positioned at the predetermined position by the positioning means 6 from the positioning means 6 and as illustrated in FIG. 3, places the back surface Wb of the workpiece W onto the holding surface 11a of the spinner table 11 such that the front surface Wa of the workpiece W faces upward to be exposed. Then, the workpiece W is sucked and held on the holding surface 11a of the spinner table 11 by a suction effect of the suction source not illustrated, and then, the spinner table 11 is rotated by the rotating means 13 in a direction of an arrow A, for example.

The resin nozzle 12 turns in the horizontal direction with respect to the holding surface 11a of the spinner table 11, and a tip end of the resin nozzle 12 is positioned on an upper side in a center region of the front surface Wa of the workpiece W held on the spinner table 11 to drip a predetermined amount of a resin 100 toward the center region. A centrifugal force generated by rotation of the spinner table 11 causes the resin 100 to flow from the center region of the front surface Wa of the workpiece W to the outer periphery side thereof, to spread over the entire front surface Wa of the workpiece W without stagnation. In this manner, the resin 100 is coated over the entire front surface Wa of the workpiece W. Preferably, as the resin 100, an ultraviolet curable resin may be used, for example.

(2) Resin Curing Step

Figure 4:
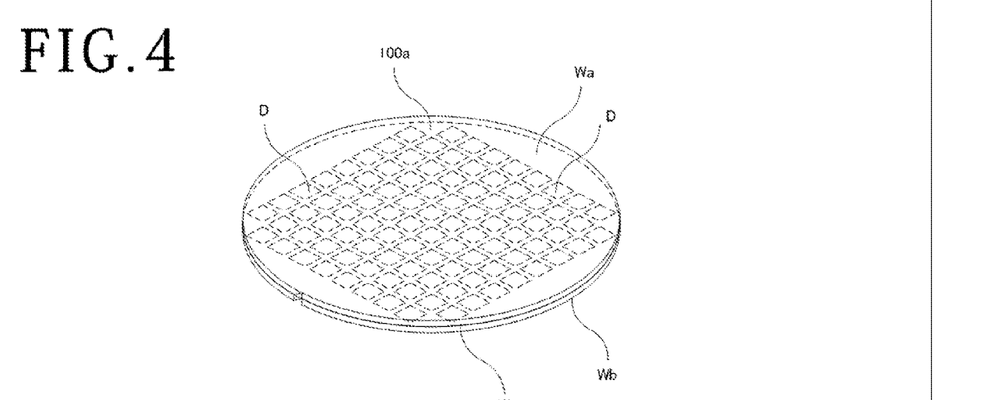
FIG. 4 is a perspective view illustrating a resin curing step.

The spinner table 11 illustrated in FIG. 1 is caused to pass through the opening 201 of the process chamber 200 of the resin curing means 20 to enter the inside of the process chamber 200. Thereafter, the plurality of ultraviolet lamps disposed in the process chamber 200 emit an ultraviolet ray toward the resin 100. The resin 100 is cured due to an external stimulus by the ultraviolet ray, and as illustrated in FIG. 4, the cured resin 100*a* is formed over the entire front surface Wa of the workpiece W.

(3) Resin Grinding Step

Figure 5:
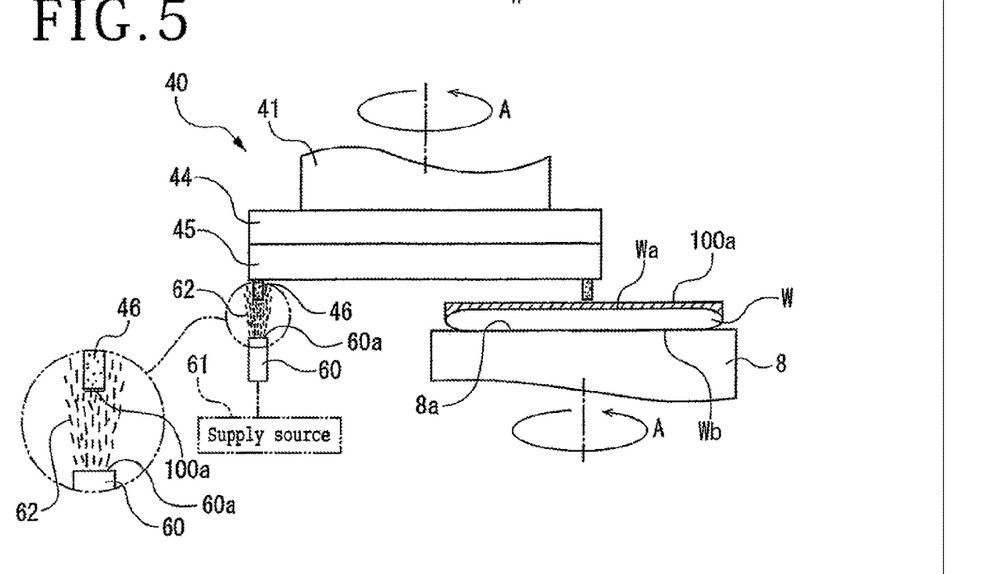
FIG. 5 is a partial cross-sectional side view illustrating a resin grinding step.

After the resin curing step is performed, the spinner table 11 is retracted from the process chamber 200 illustrated in FIG. 1. The first transfer unit 31 unloads the workpiece W from the spinner table 11 and as illustrated in FIG. 5, places the back surface Wb of the workpiece W on the holding surface 8*a* of the chuck table 8, so that a resin 100*a* coated on the front surface Wa faces upward to be exposed. After the workpiece W is sucked and held on the holding surface 8*a* of the chuck table 8 by a suction effect of the suction source not illustrated, the chuck table 8 is rotated in the direction of the arrow A, for example, and moved below the grinding unit 40. The grinding unit 40 rotates the grinding wheel 45 in the direction of the arrow A, for example, and lowers the grinding wheel 45 at a predetermined grinding feed speed, thereby pressing the resin 100*a* with the rotating grinding stones 46 to grind the resin 100*a* to be flattened. Incidentally, by inclining the chuck table 8 or the spindle 41 at a predetermined angle, each grinding surface of the grinding stones 46 and the holding surface 8*a* of the chuck table 8 may be adjusted so as to be in parallel to each other in advance.

Figure 6:
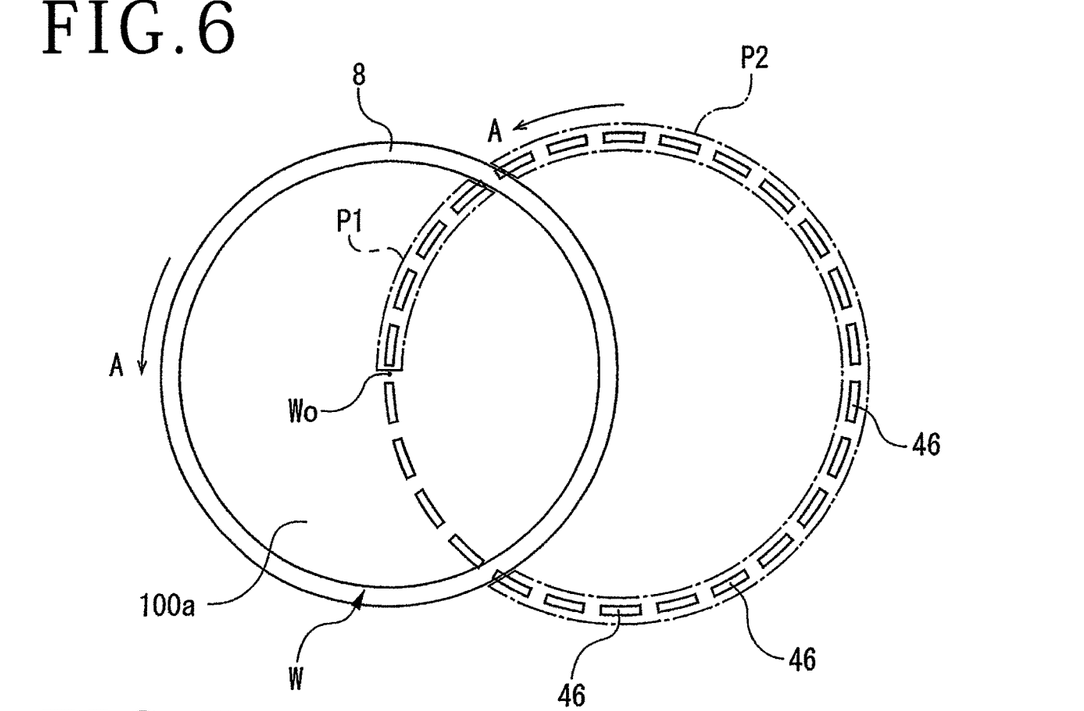
FIG. 6 is a schematic view for explanation of a processing point and a non-processing point of grinding stones in the resin grinding step.

In the resin grinding step, grinding of the resin 100*a* is performed while cleaning the grinding stones 46 by jetting the cleaning water 62 from the jetting port 60*a* of the cleaning nozzle 60 to the grinding stones 46. In this case, as illustrated in FIG. 6, among rotationary trajectories of the grinding stones 46 which rotate in the direction of the arrow A, a processing region having a circular arc shape is a processing point P1 where the grinding stones 46 actually come in contact with the resin 100*a* to perform grinding, whereas a non-processing region which is positioned outside the chuck table 8 and where the grinding stones 46 do not come in contact with the resin 100*a* is a non-processing point P2. During grinding the resin 100*a*, with the grinding stones 46 always passing through a center Wo of the workpiece W, the grinding stones 46 are brought into contact with the resin 100*a* at the processing point P1 to keep grinding the resin 100*a*.

When the rotating grinding stones 46 pass through the processing point P1 and reach the non-processing point P2, the resin 100*a* is stuck to the grinding stones 46 which have been moved to the non-processing point P2. More specifically, as illustrated in a partly enlarged view of FIG. 5, the grinding stones 46 which are not in contact with the resin 100*a* coated on the front surface Wa of the workpiece W are in a state in which the resin 100*a* is stuck. To remove this resin 100*a*, during grinding the resin 100*a*, the supply source 61 is constantly operated to jet the cleaning water 62 from the jetting port 60*a* of the cleaning nozzle 60 to the grinding stones 46 thereby washing off the resin 100*a* stuck to the grinding stones 46. A position of the cleaning nozzle 60 is not particularly limited, but the cleaning nozzle 60 may be arranged at any position of the non-processing point P2.

After grinding the resin 100*a* to be flattened, the measuring means 70 illustrated in FIG. 1 is used to measure a resin thickness of the resin 100*a* coated on the front surface Wa of the workpiece W. According to a measurement result of the measuring means 70, when the resin thickness of the measured resin 100*a* obtained is a predetermined thickness, the resin grinding step is ended and proceeds to the workpiece grinding step to be described later. Meanwhile, when the resin thickness of the measured resin 100*a* does not reach the predetermined thickness, the resin 100*a* may be ground with the grinding stones 46 again to reach the predetermined thickness.

(4) Workpiece Grinding Step

The second transfer unit 32 illustrated in FIG. 1 transfers the workpiece W from the chuck table 8 to the cleaning means 7. After the workpiece W is cleaned by the cleaning means 7, the front/back surface inversion transfer unit 33 holds the resin 100*a* side coated on the front surface Wa of the workpiece W by the transfer pad 330 and inverts the front surface and the back surface of the workpiece W by inverting the horizontal support portion 331, causing the back surface Wb of the workpiece W to face upward. In such a state, the second transfer unit 32 takes over the workpiece W from the front/back surface inversion transfer unit 33 to hold the workpiece W.

Figure 7:
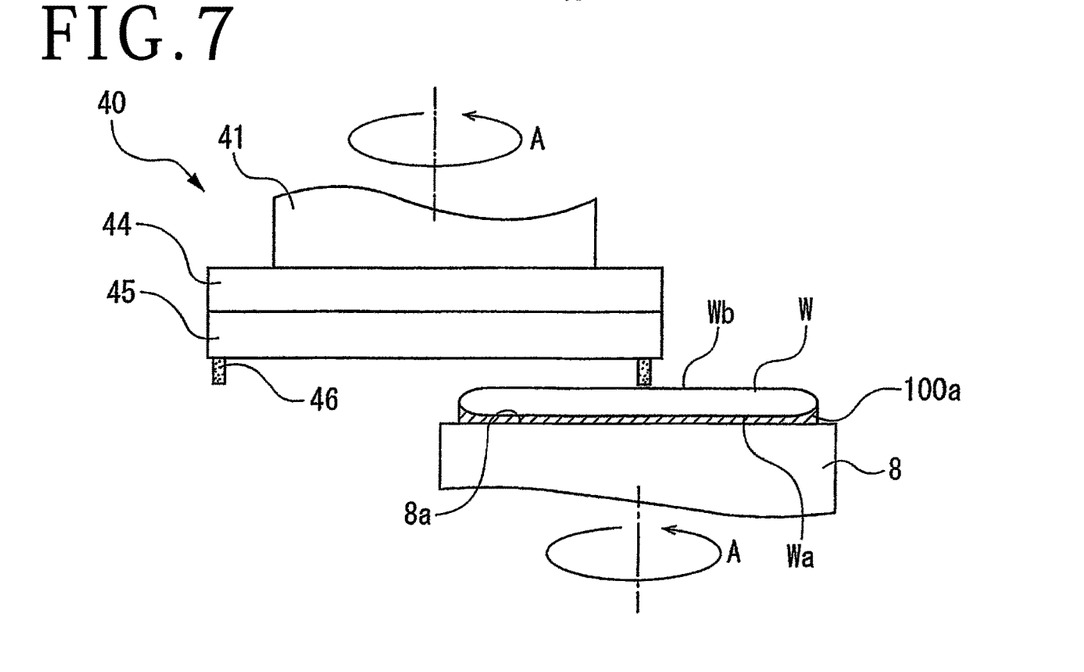
FIG. 7 is a partial cross-sectional side view illustrating a workpiece grinding step.

The second transfer unit 32 places the resin 100*a* side coated on the front surface Wa of the workpiece W on the holding surface 8*a* of the chuck table 8 as illustrated in FIG. 7, so that the back surface Wb faces upward to be exposed. After the workpiece W is sucked and held on the holding surface 8*a* of the chuck table 8 by a suction effect of the suction source not illustrated, the chuck table 8 is moved below the grinding unit 40 while rotating the chuck table 8 in the direction of the arrow A, for example.

In the workpiece grinding step, the same grinding stones 46 as those in the resin grinding step are used to grind the back surface Wb of the workpiece W. More specifically, after the resin 100*a* side coated on the front surface Wa of the workpiece W is sucked and held on the holding surface 8*a* of the chuck table 8, the chuck table 8 is moved below the grinding unit 40 while rotating the chuck table 8 in the direction of the arrow A, for example. The grinding unit 40 lowers the grinding wheel 45 at a predetermined grinding feed speed while rotating the grinding wheel 45 in the direction of the arrow A, for example. Then, the grinding unit 40 grinds the back surface Wb of the workpiece W, pressing the back surface Wb of the workpiece W with the rotating grinding stones 46, until the thickness of the workpiece W reaches the predetermined thickness. Since the grinding stones 46 do not have the resin 100*a* remained thereon, it is possible to favorably thin the workpiece W.

Thus, the workpiece processing method according to the present invention includes a resin coating step of coating the resin 100 on the front surface Wa of the workpiece W, a resin curing step of applying an ultraviolet ray to the coated resin 100 to be cured, a resin grinding step of grinding the cured resin 100*a* to be flattened with the grinding stones 46, and a workpiece grinding step of holding the flattened, cured resin 100*a* side of the workpiece W on the chuck table 8 and grinding the back surface Wb of the workpiece W with the grinding stones 46. In the resin grinding step, it is configured such that grinding is performed while cleaning the cured resin 100*a* stuck to the grinding stones 46. Accordingly, it is possible to grind the cured resin 100*a* coated on the front surface Wa of the workpiece W and the back surface Wb of the workpiece W in the same apparatus. Thus, according to the present invention, it is possible to efficiently process the workpiece W without increasing the number of steps of grinding.

Also, in the resin grinding step, the cleaning water 62 is jetted from the cleaning nozzle 60 to the grinding stones 46, and grinding of the resin 100*a* is performed while cleaning the resin 100*a* stuck to the grinding stones 46. Accordingly, the resin 100*a* does not remain on the grinding stones 46 after the resin grinding step is ended. Hence, it is possible to perform the workpiece grinding step by use of the same grinding stones 46, thereby enhancing processing efficiency.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus used in processing of a workpiece having a device in each of a plurality of regions demarcated by a plurality of dividing lines formed on a front surface of the workpiece in a grid pattern, the processing apparatus comprising:
   an apparatus base;
   a chuck table holding the workpiece;
   a positioning means for positioning the workpiece to a predetermined position before grinding at a grinding unit;
   a resin coating means including a spinner table, said spinner table is a rotatable spinner table and said resin coating means coating the front surface of the workpiece with a resin, while the workpiece is held on the spinner table;
   a cleaning means for cleaning the workpiece coated with the resin after the grinding at the grinding unit;
   the grinding unit including grinding stones which grind a back surface of the workpiece and the resin coated on the front surface of the workpiece; and
   a transfer unit which loads/unloads the workpiece to/from the chuck table and causes the front surface and the back surface of the workpiece unloaded from the chuck table to be inverted;
   the positioning means and the cleaning means are located within a movable range of the transfer unit;
   the transfer unit includes:
   a first transfer unit which directly transfers the workpiece from the positioning means to the spinner table and from the spinner table to the chuck table, wherein the first transfer unit includes a first transfer pad that is configured and arranged for holding the workpiece,
   a second transfer unit which directly transfers the workpiece from the chuck table to the cleaning means, wherein the second transfer unit includes a second transfer pad that is configured and arranged for holding the workpiece, and
   a front/back surface inversion transfer unit which transfers the workpiece from the cleaning means to the second transfer unit, wherein the front/back surface inversion transfer unit includes a third transfer pad that is configured and arranged for holding the workpiece,
   wherein:
   the front/back surface inversion transfer unit holds the workpiece via the third transfer pad, after the front surface of the workpiece which includes the resin has been cleaned by the cleaning means, and inverts the front surface and the back surface of the workpiece, causing the back surface of the workpiece to face upward,
   the second transfer unit takes the workpiece from the front/back surface inversion transfer unit, with the back surface of the workpiece facing upward and the second transfer unit directly transfers the workpiece to the chuck table,
   the chuck table holds the front surface of the workpiece, and
   the grinding unit grinds the back surface of the workpiece with the grinding stones,
   wherein said transfer unit, said cleaning means, said grinding unit, said resin coating means, said positioning means, and said cleaning means, are all located on a same surface of the apparatus base.

2. The processing apparatus according to claim 1, wherein a resin thickness of the resin after grinding with the grinding stones is measured, and the back surface of the workpiece is thinned to a predetermined thickness.

3. The processing apparatus according to claim 1, further comprising:
   a cleaning nozzle jetting cleaning water to the grinding stones,
   wherein the resin is ground with the grinding stones while resin stuck to the grinding stones is cleaned.

4. The processing apparatus according to claim 1, wherein grinding of the resin and grinding of the back surface of the workpiece are performed with same grinding stones.

* * * * *